United States Patent
Nakazawa et al.

(10) Patent No.: US 7,869,062 B2
(45) Date of Patent: Jan. 11, 2011

(54) APPARATUS FOR SUPPORTING SUBSTRATE, APPARATUS FOR MEASURING SURFACE POTENTIAL, APPARATUS FOR MEASURING FILM THICKNESS, AND APPARATUS FOR INSPECTING SUBSTRATE

(75) Inventors: Yoshiyuki Nakazawa, Kyoto (JP); Takamasa Sakai, Kyoto (JP)

(73) Assignee: Dainippon Screen MFG Co., Ltd., Kyoto-shi, Kyoto (JP)

( * ) Notice: Subject to any disclaimer, the term of this patent is extended or adjusted under 35 U.S.C. 154(b) by 549 days.

(21) Appl. No.: 12/007,299

(22) Filed: Jan. 9, 2008

(65) Prior Publication Data
US 2008/0174637 A1    Jul. 24, 2008

(30) Foreign Application Priority Data
Jan. 18, 2007  (JP) ............................ P2007-008750

(51) Int. Cl.
  *G01B 11/28*  (2006.01)
  *G01J 4/00*   (2006.01)
(52) U.S. Cl. .................. 356/630; 356/364; 156/345.23; 156/345.13; 156/345.24
(58) Field of Classification Search .................. 356/630, 356/364–369; 156/345.13, 345.24, 344, 156/345.23; 369/101; 438/459, 460
See application file for complete search history.

(56) References Cited

U.S. PATENT DOCUMENTS

| 7,095,699 B2 | 8/2006 | Miura et al. |
| 7,579,257 B2 * | 8/2009 | Yanagita et al. ............. 438/455 |
| 2006/0191556 A1 * | 8/2006 | Nakazawa et al. ............. 134/2 |

FOREIGN PATENT DOCUMENTS

| JP | 2003-316017 | 11/2003 |
| JP | 2005-147956 | 6/2005 |

* cited by examiner

*Primary Examiner*—L. G Lauchman
(74) *Attorney, Agent, or Firm*—McDermott Will & Emery LLP

(57) ABSTRACT

In a substrate supporting apparatus of a surface potential measuring apparatus, a first fluid is ejected around a target region on an upper surface of a substrate from a circular-shaped first porous member of a first fluid ejection part and a second fluid is ejected onto a lower surface of the substrate from a circular-shaped second porous member of a second fluid ejection part which is opposite to the first fluid ejection part. The substrate can be supported and flattened between the first fluid ejection part and the second fluid ejection part. Also, it is possible to keep the distance between the substrate and the first porous member, with a simple construction. As a result, a probe can be positioned above a flatted target region with leaving a predetermined spacing, to perform measurement of a surface potential of the target region on the substrate with high accuracy.

25 Claims, 4 Drawing Sheets

APPARATUS FOR SUPPORTING SUBSTRATE, APPARATUS FOR MEASURING SURFACE POTENTIAL, APPARATUS FOR MEASURING FILM THICKNESS, AND APPARATUS FOR INSPECTING SUBSTRATE

BACKGROUND OF THE INVENTION

1. Field of the Invention

The present invention relates to a substrate supporting apparatus for supporting a substrate, and a surface potential measuring apparatus, a film thickness measuring apparatus, and a substrate inspection apparatus, each of which having the substrate supporting apparatus.

2. Description of the Background Art

In manufacturing of semiconductor devices, flat panel displays, and the like, various measurements or processings have been conventionally performed on surfaces of various substrates such as a semiconductor substrate and a glass substrate for a flat panel display. In apparatuses performing such measurements or processings, a substrate holding apparatus for holding a substrate by suction has been used as one of holding parts for holding a substrate.

For example, Japanese Patent Application Laid-Open No. 2003-316017 (Document 1) discloses an electron beam irradiation apparatus which has a spinning table on which a master disk of an optical disk is held, where an electron beam is applied onto the master disk which is rotated together with the spinning table to record information on the master disk. The electron beam irradiation apparatus further has a floating pad which has a ring-shaped air-permeable member formed of porous metal member and an electron beam irradiation head which is mounted on the floating pad. The floating pad ejects compressed air onto the upper surface of the master disk through the air-permeable member and thereby the floating pad floats in a noncontact manner over the master disk. With this structure, influences of unevenness in thickness, rotational vibrations of the master disk, or the like are reduced to keep a gap between the electron beam irradiation head and the master disk.

Since a substrate where various processings such as a film deposition or an annealing process are performed normally has a slight warpage, tilt, or the like, the substrate does not have a completely flat shape. Therefore, there is a limitation in improving the accuracy of various processings or inspections which are performed assuming that the substrate has a flat shape. In the electron beam irradiation apparatus of Document 1, it is aimed that influences such as unevenness in thickness of the master disk are reduced, however, there is a possibility unwanted particles adhere on a lower surface of the master disk or the lower surface is scratched because the master disk contacts the spinning table. Although the spinning table needs to be upsized with upsizing of the master disk, it is difficult to accurately form an upper surface of an upsized spinning table on which the master disk is placed and manufacturing cost for the spinning table is increased.

SUMMARY OF THE INVENTION

The present invention is intended for a substrate supporting apparatus for supporting a substrate. It is an object of the present invention to support the substrate while flattening the substrate.

The substrate supporting apparatus comprises: a first fluid ejection part having a first porous member for ejecting a first fluid around a target region on one main surface of a substrate; a second fluid ejection part which is positioned opposite to the first fluid ejection part and has a second porous member for ejecting a second fluid onto the other main surface of the substrate, to support the substrate between the first porous member and the second porous member in a noncontact manner; a movement control part which is in contact with a perimeter part of the substrate and controls movement of the substrate in a direction parallel to the one main surface; and a moving mechanism for shifting the target region by moving the first fluid ejection part relatively to the substrate along the one main surface of the substrate. In the substrate supporting apparatus, the substrate can be supported and flattened between the first fluid ejection part and the second fluid ejection part.

According to a preferred embodiment of the present invention, the first porous member of the substrate supporting apparatus has a ring shape surrounding the target region. More preferably, the first porous member has a circular shape.

According to another preferred embodiment of the present invention, the first fluid ejection part of the substrate supporting apparatus further comprises a closing part which is located on the first porous member to close a space inside the first porous member. More preferably, the space inside the first porous member is made to an inert gas atmosphere or a reduced pressure atmosphere.

According to still another preferred embodiment of the present invention, the second fluid ejection part of the substrate supporting apparatus ejects the second fluid onto a part of the other main surface of the substrate and moves relatively to the substrate together with the first fluid ejection part. More preferably, the first porous member and the second porous member have the same shape and overlap each other in a direction perpendicular to the substrate.

The present invention is also intended for a surface potential measuring apparatus which comprises the above substrate supporting apparatus and measures a surface potential of a substrate, and it is possible to measure a surface potential of the substrate with high accuracy by using the apparatus. The present invention is further intended for a film thickness measuring apparatus which comprises the above substrate supporting apparatus and measures a thickness of a film formed on a substrate, and it is possible to measure a thickness of a film formed on the substrate with high accuracy by using the apparatus. The present invention is still further intended for a substrate inspection apparatus which comprises the above substrate supporting apparatus and inspects a substrate, and it is possible to perform a high accurate inspection on the substrate by using the apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
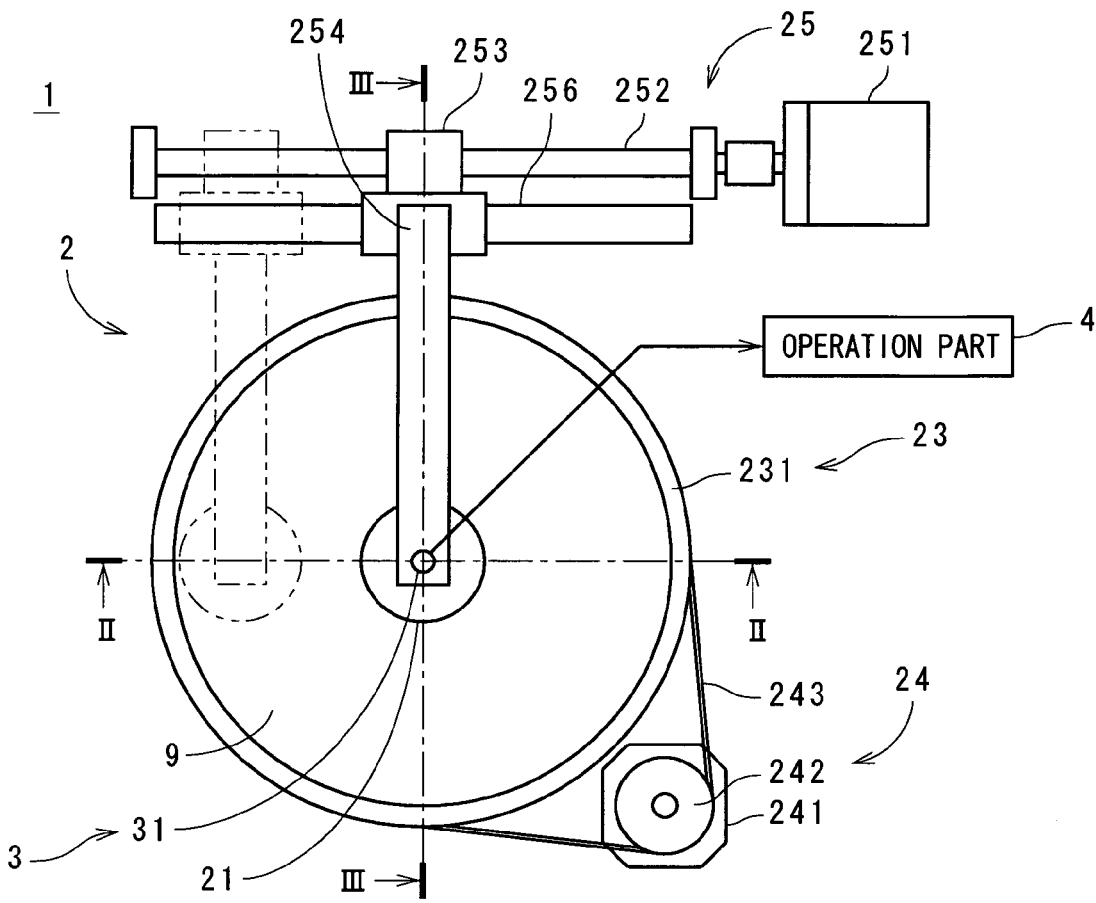
FIG. 1 is a plan view showing a construction of a surface potential measuring apparatus in accordance with the first preferred embodiment.
Figure 2:
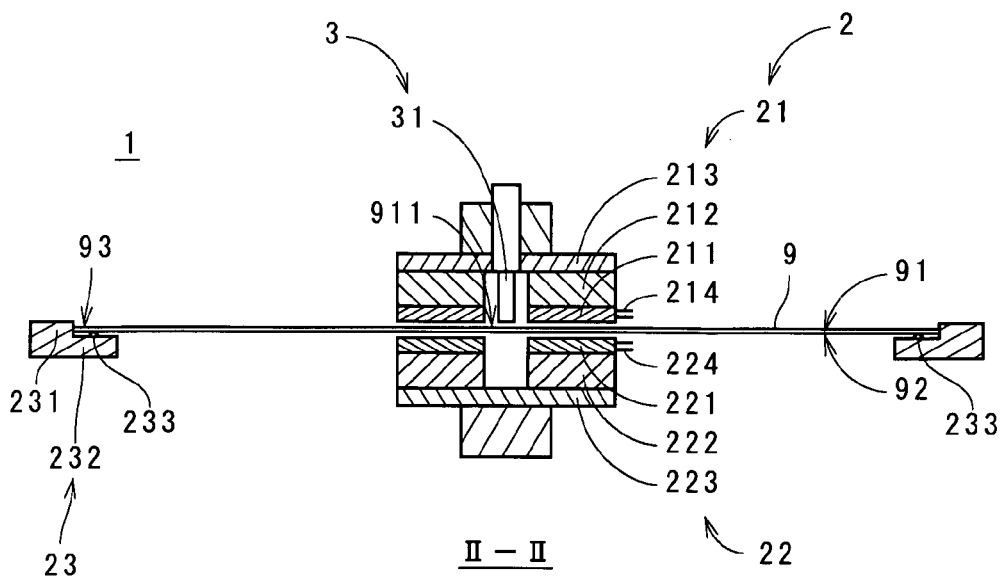
FIGS. 2 and 3 are longitudinal sectional views of the surface potential measuring apparatus.

FIG. 1 is a plan view showing a construction of a surface potential measuring apparatus 1 in accordance with the first preferred embodiment of the present invention. FIG. 2 is a longitudinal sectional view of the surface potential measuring apparatus 1 at the position indicated by the arrows II-II in FIG. 1. The surface potential measuring apparatus 1 is an apparatus for measuring a surface potential of a disk-shaped semiconductor substrate 9 (hereinafter, referred to as "substrate 9"). An operation part 4 shown in FIG. 1 is omitted in FIG. 2.

As shown in FIGS. 1 and 2, the surface potential measuring apparatus 1 has a substrate supporting apparatus 2 for supporting the substrate 9, a measuring part 3 having a probe 31 which is opposite to the substrate 9 and attached to a later-discussed first fluid ejection part 21 of the substrate supporting apparatus 2, and the operation part 4 for obtaining a surface potential of the substrate 9 on the basis of an output from the measuring part 3 as shown in FIG. 1. In the following discussion, a region which exists on one main surface 91 of the substrate 9 shown in FIG. 2 (the main surface 91 is an upper main surface of the substrate 9 in FIG. 2 and hereinafter, referred to as a "upper surface 91") and is opposite to the probe 31 for measuring a surface potential (i.e., a region which is a measurement object of a surface potential), is referred to as a "target region 911".

As shown in FIG. 2, the substrate supporting apparatus 2 has the first fluid ejection part 21 which is positioned above the substrate 9 and a second fluid ejection part 22 which is positioned below the substrate 9 and is opposite to the first fluid ejection part 21 across the substrate 9. The first fluid ejection part 21 is circle in the plan view shown in FIG. 1. In the following discussion, a main surface 92 of the substrate 9 which faces the second fluid ejection part 22 shown in FIG. 2 (i.e., the other main surface of the substrate 9 which is the opposite side of the upper surface 91) is referred to as a "lower surface 92".

The first fluid ejection part 21 has a first porous member 211 which has a circular shape surrounding the target region 911 on the upper surface 91 of the substrate 9 and ejects a fluid around the target region 911 (i.e., ejects the fluid onto a part of the upper surface 91 of the substrate 9). The centers of inner and outer peripheral edges of the first porous member 211 coincide with each other.

The first fluid ejection part 21 further has a circular-shaped first base part 212 supporting the first porous member 211 above the first porous member 211 and a disk-shaped first closing part 213 closing an upper opening of the first base part 212. In the first fluid ejection part 21, the first closing part 213 is a closing part which is located on the first porous member 211 to close a space inside the first porous member 211 (i.e., a space inside the inner peripheral edge of the first porous member 211).

The second fluid ejection part 22 has a second porous member 221 which is opposite to the first porous member 211 of the first fluid ejection part 21 and ejects a fluid onto a part of the lower surface 92 of the substrate 9. The second porous member 221 has the same shape as the first porous member 211 in the plan view (i.e., the circular shape where the centers of inner and outer peripheral edges coincide with each other) and the second porous member 221 overlaps with the first porous member 211 in a direction perpendicular to the substrate 9.

The second fluid ejection part 22 further has a circular-shaped second base part 222 supporting the second porous member 221 below the second porous member 221 and a disk-shaped second closing part 223 closing a lower opening of the second base part 222. In the second fluid ejection part 22, the second closing part 223 is a closing part which is located on the second porous member 221 to close a space inside the second porous member 221 (i.e., a space inside the inner peripheral edge of the second porous member 221). In the plan view, each area of the first porous member 211 and the second porous member 221 is smaller than that of the substrate 9.

The first porous member 211 and the second porous member 221 are formed of porous ceramic, porous stainless steel, or the like. The first porous member 211 and the second porous member 221 may be formed of other metallic porous material other than stainless material or plastic porous material. Each porosity of the first porous member 211 and the second porous member 221 (i.e., a percentage of a space in the porous member) is preferably made to be equal to or larger than 1% and equal to or smaller than 10% (more preferably, equal to or larger than 3% and equal to or smaller than 5%). In the present preferred embodiment, the first porous member 211 and the second porous member 221 are formed of the same material and their porosities are almost equal.

Each inner diameter of the first porous member 211 and the second porous member 221 is preferably made to be equal to or greater than 10 mm (millimeter) and equal to or smaller than 50 mm, and an outer diameter of the each porous member is preferably made to be equal to or greater than 50 mm and equal to or smaller than 100 mm. A difference between the outer diameter and the inner diameter of each porous member is made to be equal to or greater than 10 mm.

An approximately circular-shaped passage (not shown) is formed in the first porous member 211 and the passage is connected to a first fluid supplying apparatus (not shown) with interposing an gas supplying port 214. In the first fluid ejection part 21, a fluid is supplied to the passage from the first fluid supplying apparatus (the fluid is hereinafter referred to as "first fluid") and the first fluid is uniformly ejected onto the upper surface 91 of the substrate 9 from the whole lower surface of the first porous member 211.

Similarly to the first porous member 211, an approximately circular-shaped passage (not shown) is formed in the second porous member 221 and the passage is connected to a second fluid supplying apparatus (not shown) with interposing an gas supplying port 224. In the second fluid ejection part 22, a fluid is supplied to the passage from the second fluid supplying apparatus (the fluid is hereinafter referred to as "second fluid") and the second fluid is uniformly ejected onto the lower surface 92 of the substrate 9 from the whole upper surface of the second porous member 221.

In the substrate supporting apparatus 2, the first porous member 211 of the first fluid ejection part 21 and the second porous member 221 of the second fluid ejection part 22 eject the first fluid and the second fluid onto the substrate 9, and the substrate 9 is thereby supported between the first porous member 211 and the second porous member 221 in a noncontact manner. In the present preferred embodiment, the first fluid and the second fluid, which are ejected from the first porous member 211 and the second porous member 221, are gasses (for example, pressurized airs). A distance between the first porous member 211 and the upper surface 91 of the substrate 9 in a direction perpendicular to the substrate 9 is made to be equal to or greater than 5 μm (micrometer) and equal to or smaller than 30 μm. Similarly, a distance between the second porous member 221 and the lower surface 92 of the substrate 9 in a direction perpendicular to the substrate 9 is made to be equal to or greater than 5 μm and equal to or smaller than 30 μm. The first fluid and the second fluid may be the same fluid or may be different kinds of fluids.

Since various processings such as a film deposition or an annealing process are performed on the substrate 9, the substrate 9 has a slight warpage or tilt and it does not have a completely flat shape. In the substrate supporting apparatus 2, a portion of the substrate 9 between the first porous member 211 and the second porous member 221 is pressed from both sides of the substrate 9 (i.e., from the upper surface 91 and the lower surface 92) by the first fluid and the second fluid which are ejected from the first porous member 211 and the second porous member 221, and the portion is thereby flattened (i.e., the portion is made or kept flat).

As shown in FIGS. 1 and 2, the substrate supporting apparatus 2 has a circular-shaped guide part 23 arranged around the substrate 9, and the guide part 23 has a circular-shaped movement control part 231 which is in contact with or opposite to an outer peripheral surface of the substrate 9 over the whole outer edge. The movement control part 231 controls movement of the substrate 9 in a direction parallel to the upper surface 91 and the lower surface 92. As shown in FIG. 2, the guide part 23 has an auxiliary supporting part 232 for auxiliary supporting the substrate 9 by bringing a plurality of supporting pins 233 into contact with the lower surface 92 of the substrate 9 in the vicinity of the perimeter part (i.e., outer part) 93 of the substrate 9. In the present preferred embodiment, three or more supporting pins 233 are arranged at equal pitch.

The substrate supporting apparatus 2 has a substrate rotation mechanism 24 for rotating the substrate 9 together with the guide part 23 around the central axis which passes through the center of the substrate 9 and is perpendicular to the substrate 9, as shown in FIG. 1. The substrate rotation mechanism 24 has a first motor 241, a pulley 242 attached to a rotation axis of the first motor 241, and a loop-like belt 243 which is in contact with an outer peripheral surface of the pulley 242 and an outer peripheral surface of the guide part 23. In the substrate rotation mechanism 24, the pulley 242 rotates clockwise by the first motor 241 in FIG. 1, and the guide part 23 is thereby rotated clockwise together with the substrate 9 in FIG. 1. A guiding part for guiding the guide part 23 in a rotation direction while supporting it is not shown in FIG. 2 (the same as in FIGS. 3 to 5 and FIG. 7).

Figure 3:
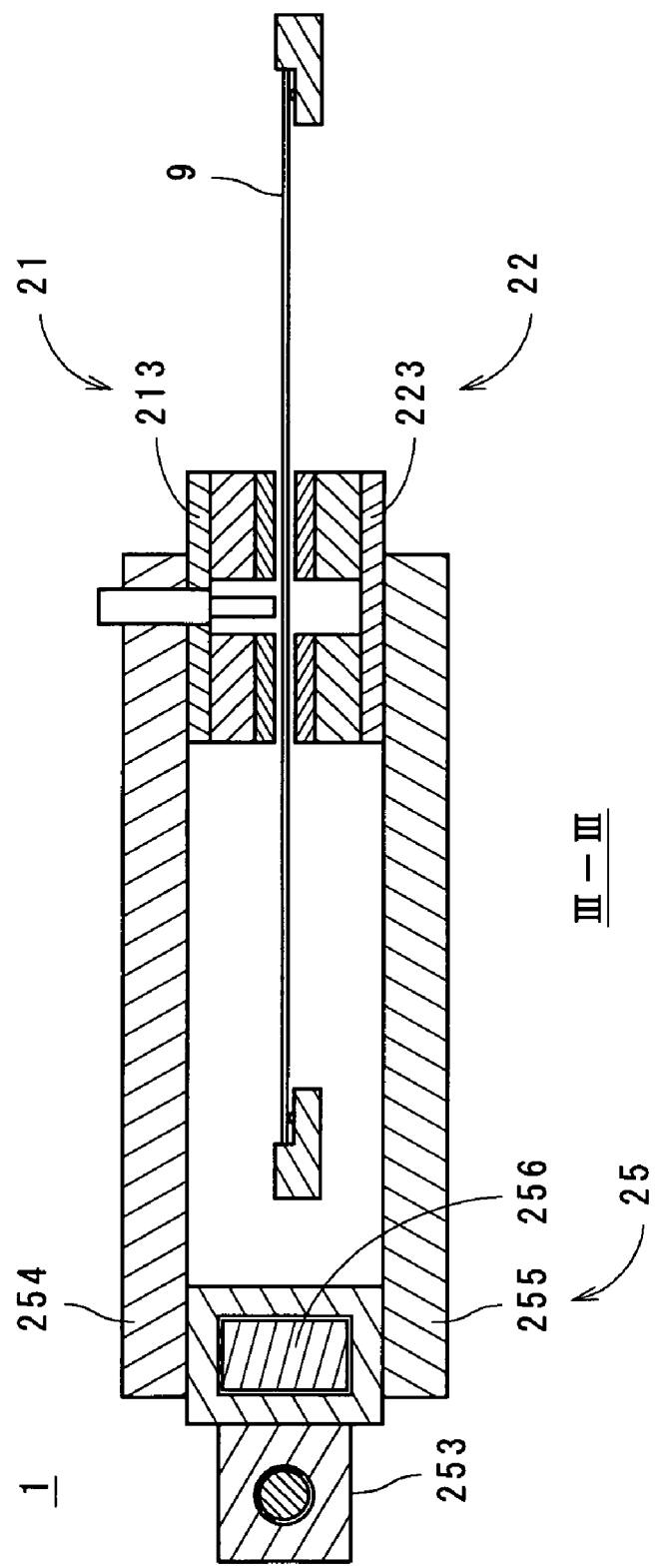

FIG. 3 is a longitudinal sectional view of the surface potential measuring apparatus 1 at the position indicated by the arrows III-II in FIG. 1. As shown in FIGS. 1 and 3, the substrate supporting apparatus 2 of the surface potential measuring apparatus 1 has an ejection part moving mechanism 25 for moving the first fluid ejection part 21 and the second fluid ejection part 22 along the upper surface 91 and the lower surface 92 of the substrate 9 in a horizontal direction of FIG. 1. As shown in FIG. 1, the ejection part moving mechanism 25 has a second motor 251, a ball screw 252 connected to the second motor 251, a nut 253 which is threadably mounted on the ball screw 252, a first arm 254 which is fixed on the nut 253 and holds the first fluid ejection part 21, and a second arm 255 which is fixed on the nut 253 and holds the second fluid ejection part 22, as shown in FIG. 3. The first closing part 213 of the first fluid ejection part 21 and the second closing part 223 of the second fluid ejection part 22 are fixed on the first arm 254 and the second arm 255, respectively, as shown in FIG. 3.

In the ejection part moving mechanism 25 shown in FIG. 1, the ball screw 252 rotates by the second motor 251 to move the nut 253 along the ball screw 252, and thereby the first arm 254 and the first fluid ejection part 21 move relatively to the substrate 9 along a slider 256 which is provided in parallel with the ball screw 252. Also, the second arm 255 and the second fluid ejection part 22 shown in FIG. 3 move relatively to the substrate 9 along the slider 256 together with the first fluid ejection part 21.

In the surface potential measuring apparatus 1 shown in FIG. 1, the substrate 9 rotates around the central axis by the substrate rotation mechanism 24 and the first fluid ejection part 21 and the second fluid ejection part 22 (see FIG. 2) move along the upper surface 91 and the lower surface 92 (see FIG. 2) of the substrate 9 by the ejection part moving mechanism 25, to thereby move the probe 31 of the measuring part 3 relatively to the substrate 9, which is attached to the first fluid ejection part 21.

As shown in FIG. 2, since a top end of the probe 31 faces the upper surface 91 of the substrate 9 through the space inside the circular-shaped first porous member 211 of the first fluid ejection part 21, a region which exists on the upper surface 91 of the substrate 9 and is opposite to the probe 31 (i.e., the region is the target region 911), is included in a circular region inside the first porous member 211 in the plan view. In the surface potential measuring apparatus 1, the target region 911 is moved on the upper surface 91 of the substrate 9 by the relative movement of the first fluid ejection part 21 to the substrate 9. That is to say, in the substrate supporting apparatus 2, the substrate rotation mechanism 24 and the ejection part moving mechanism 25 function as a moving mechanism for shifting the target region 911 by moving the first fluid ejection part 21 relatively to the substrate 9 along the upper surface 91 of the substrate 9.

In the surface potential measuring apparatus 1, surface potentials of the substrate 9 are sequentially measured by the probe 31 of the measuring part 3 while shifting the target region 911 on the upper surface 91 of the substrate 9 by the moving mechanism (i.e., the substrate rotation mechanism 24 and the ejection part moving mechanism 25). In the operation part 4, surface potentials of target regions 911 on the substrate 9 are sequentially obtained on the basis of outputs from the measuring part 3, to obtain surface potential of the whole upper surface 91 (or a predetermined region) of the substrate 9.

As discussed above, in the substrate supporting apparatus 2 of the surface potential measuring apparatus 1, the first fluid is ejected around the target region 911 on the upper surface 91 of the substrate 9 from the first porous member 211 of the first fluid ejection part 21 and the second fluid is ejected onto the lower surface 92 of the substrate 9 from the second porous member 221 of the second fluid ejection part 22 which is opposite to the first fluid ejection part 21 across the substrate 9. With this operation, the substrate 9 can be supported and flattened between the first fluid ejection part 21 and the second fluid ejection part 22 (i.e., the target region 911 is flattened). Also, it is possible to keep the distance between the substrate 9 and the first porous member 211 of the first fluid ejection part 21 constant, with a simple construction without providing other mechanism such as an autofocus mechanism. As a result, the probe 31 can be positioned above the flattened target region 911 with leaving a predetermined spacing in the surface potential measuring apparatus 1, to perform measurement of a surface potential of the target region 911 on the substrate 9 with high accuracy. Also, it is possible to reduce working hours required for focusing and the like, and achieve rapid measurement of a surface potential.

In the case of the conventional substrate supporting apparatus where a substrate is held by suction, there is a possibility unwanted particles adhere on a lower surface of the substrate, which is in contact with a stage of the substrate supporting apparatus, or the lower surface is scratched. When foreign substances adhere on the stage, a region on the substrate, which is close to the foreign substances, sags to be deformed. On the other hand, since the first porous member 211 and the second porous member 221 are not in contact with the substrate 9 in the substrate supporting apparatus 2, adhesion of unwanted particles on the lower surface 92 of the substrate 9 or damage to the lower surface 92 can be prevented. If foreign substances adhere on a surface of the first porous member 211 or a surface of the second porous member 221, it is possible to prevent the substrate 9 from being deformed by influences of the foreign substances. As a result, it is possible to perform measurement of a surface potential of the target region 911 on the substrate 9 with higher accuracy in the surface potential measuring apparatus 1.

In the surface potential measuring apparatus 1, the probe 31 of the measuring part 3 is attached to the first fluid ejection part 21, and the first fluid ejection part 21 moves relatively to the upper surface 91 of the substrate 9 by the substrate rotation mechanism 24 and the ejection part moving mechanism 25, to thereby change the target region 911 (i.e., shift the target region 911) which is a measurement object of a surface potential. At this time, since the first fluid ejection part 21 rapidly performs relative movement without contacting with the substrate 9, change of the target region 911 can be rapidly performed. Consequently, it is possible to rapidly perform measurement of surface potentials of the whole substrate 9.

In the substrate supporting apparatus 2, the second fluid ejection part 22 has a construction for ejecting the second fluid onto a part of the lower surface 92 of the substrate 9 from the second porous member 221 and moving relatively to the substrate 9 together with the first fluid ejection part 21, to thereby downsize the second porous member 221 of the second fluid ejection part 22.

In the case of the conventional substrate supporting apparatus where the whole lower surface of a substrate is held by suction, a stage for holding the substrate needs to be upsized with upsizing of a substrate. However, it is difficult to form an upper surface of the upsized stage with accuracy and large amounts of cost is required for manufacturing a high accurate-upsized stage. On the other hand, since the second porous member 221 can be downsized in the substrate supporting apparatus 2 according to the present preferred embodiment, even if a relatively large substrate is held, an upper surface of the second porous member 221 (i.e., a surface which is opposite to the lower surface 92 of the substrate 9) can be formed with high accuracy while reducing the manufacturing cost, in comparison with the stage of the above conventional substrate supporting apparatus. As a result, it is possible to flatten the substrate 9 between the first porous member 211 and the second porous member 221 with high accuracy.

The second porous member 221 has the same shape as the first porous member 211 in the substrate supporting apparatus 2 and the second porous member 221 is arranged to overlap with the first porous member 211 in the direction of the central axis. With this structure, parts of the first porous member 211 and the second porous member 221, which do not contribute to flatten the substrate 9, can be omitted to downsize the first porous member 211 and the second porous member 221.

Since the first porous member 211 is made to a ring shape surrounding the target region 911 in the first fluid ejection part 21, uniformity of pressing force on the substrate 9 can be increased around the target region 911 and it is possible to more flatten the substrate 9 between the first fluid ejection part 21 and the second fluid ejection part 22. Also, since the first porous member 211 is made to a circular shape, uniformity of pressing force on the substrate 9 can be more increased around the target region 911 and it is possible to still more flatten the substrate 9 between the first fluid ejection part 21 and the second fluid ejection part 22. As a result, it is possible to perform measurement of a surface potential of the substrate 9 with higher accuracy in the surface potential measuring apparatus 1.

In the first fluid ejection part 21, the first porous member 211 is made to a circular shape and therefore, the first porous member 211 can be easily formed. Similarly in the second fluid ejection part 22, since the second porous member 221 is made to a circular shape, the target region 911 can be more flattened and the second porous member 221 can be easily formed. Further, in the first fluid ejection part 21, the space inside the first porous member 211 is closed by the first closing part 213 to thereby prevent floating particles and the like from adhering on the target region 911 in measurement of a surface potential.

In the substrate supporting apparatus 2, since the distance between the first porous member 211 and the upper surface 91 of the substrate 9 and the distance between the second porous member 221 and the lower surface 92 of the substrate 9 are made to be equal to or greater than 5 μm, it is possible to surely prevent the first porous member 211 and the second porous member 221 from contacting the substrate 9 in movement of the first fluid ejection part 21 and the second fluid ejection part 22. The above distances are made to be equal to or smaller than 30 μm and it is possible to fully flatten a portion of the substrate 9 between the first porous member 211 and the second porous member 221.

The first fluid and the second fluid ejected from the first fluid ejection part 21 and the second fluid ejection part 22 are gasses in the substrate supporting apparatus 2 to thereby simplify the construction of the substrate supporting apparatus 2. Further, since the auxiliary supporting part 232 for auxiliary supporting the substrate 9 is provided, the substrate 9 can be stably supported in comparison with a case where the substrate 9 is supported only by the first fluid ejection part 21 and the second fluid ejection part 22.

Figure 4:
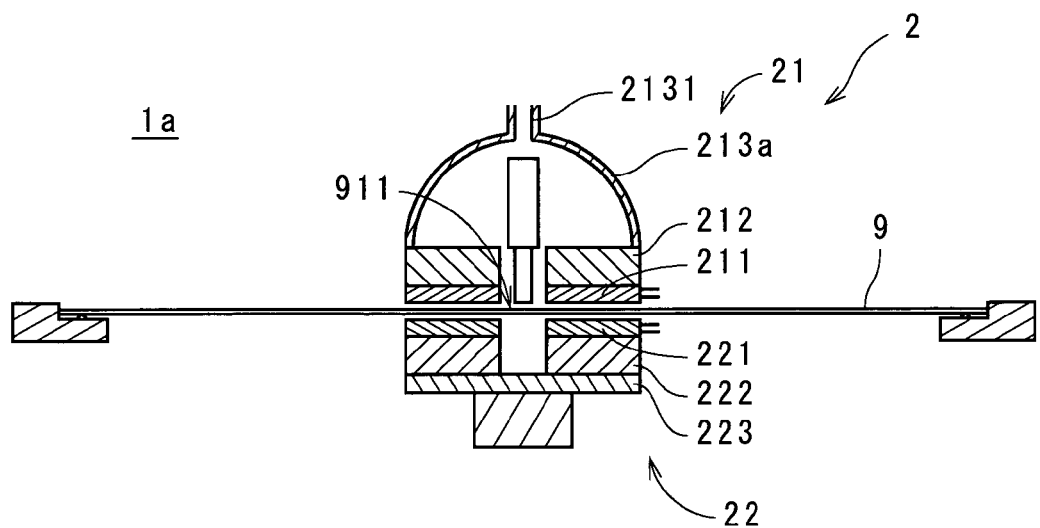
FIG. 4 is a longitudinal sectional view showing a construction of a surface potential measuring apparatus in accordance with the second preferred embodiment.

Next discussion will be made on a surface potential measuring apparatus in accordance with the second preferred embodiment of the present invention. FIG. 4 is a longitudinal sectional view showing a construction of a surface potential measuring apparatus 1a in accordance with the second preferred embodiment. FIG. 4 corresponds to FIG. 2 showing the surface potential measuring apparatus 1 in accordance with the first preferred embodiment (the same as in FIGS. 5 and 7). In a substrate supporting apparatus 2 of the surface potential measuring apparatus 1a, a dome-shaped (i.e., approximately hemispherical surface-shaped) first closing part 213a shown in FIG. 4 is provided in a first fluid ejection part 21, instead of the first closing part 213 of the substrate supporting apparatus 2 shown in FIG. 2. The other constituent elements are the same as those of the surface potential measuring apparatus 1 shown in FIGS. 1 to 3 and represented by the same reference signs in the following discussion.

In the first fluid ejection part 21 of the substrate supporting apparatus 2 shown in FIG. 4, a space in the first closing part 213a is connected to a not-shown gas supplying apparatus with interposing a connecting part 2131 provided above the first closing part 213a. In the first fluid ejection part 21, a space inside the first porous member 211 is closed by the first closing part 213a which is located on a side which is opposite to the substrate 9 of the first porous member 211, an inert gas (nitrogen ($N_2$) in the present preferred embodiment) is supplied from the gas supplying apparatus into the first closing part 213a, and thereby the space in the first closing part 213a and the space inside the first base part 212 and the first porous member 211 (i.e., space above the target region 911) are made to an inert gas atmosphere.

Similarly to the first preferred embodiment, the substrate 9 can be supported in the substrate supporting apparatus 2 of the surface potential measuring apparatus 1a while the substrate 9 is flattend between the first fluid ejection part 21 and the second fluid ejection part 22 (i.e., the target region 911 is flattend). Also, it is possible to keep the distance between the substrate 9 and the first porous member 211 of the first fluid ejection part 21 constant, with a simple construction. As a result, it is possible to perform measurement of a surface potential of the target region 911 on the substrate 9 with high accuracy. Further, it is possible to rapidly perform measurement of surface potentials of the whole substrate 9 by rapidly moving the first fluid ejection part 21 and the second fluid ejection part 22 relatively to the substrate 9.

In the substrate supporting apparatus 2, similarly to the first preferred embodiment, the space inside the first porous member 211 is closed by the first closing part 213a to thereby prevent unwanted particles and the like from adhering on the target region 911 in measurement of a surface potential.

In the substrate supporting apparatus 2 of the surface potential measuring apparatus 1a in accordance with the second preferred embodiment, since the inert gas is supplied from the gas supplying apparatus connected to the first closing part 213a, the space inside the first porous member 211 (i.e., space above the target region 911) can be made to the inert gas atmosphere, with a simple construction. Measurement is performed in a state where the space above the target region 911 is made to the inert gas atmosphere and it is possible to perform measurement of a surface potential while suppressing contamination such as organic contamination on the target region 911. As discussed above, it is possible to easily achieve an environment suitable for measurement of a surface potential in the substrate supporting apparatus 2 of the surface potential measuring apparatus 1a.

In a case where the inert gas is used as the first fluid in the first fluid ejection part 21, there may be a case where the first fluid is ejected from an inner peripheral surface of the first porous member 211 toward the space inside the first porous member 211 to make the space the inert gas atmosphere, without supplying the inert gas into the first closing part 213a from the gas supplying apparatus with interposing the connecting part 2131.

Figure 5:
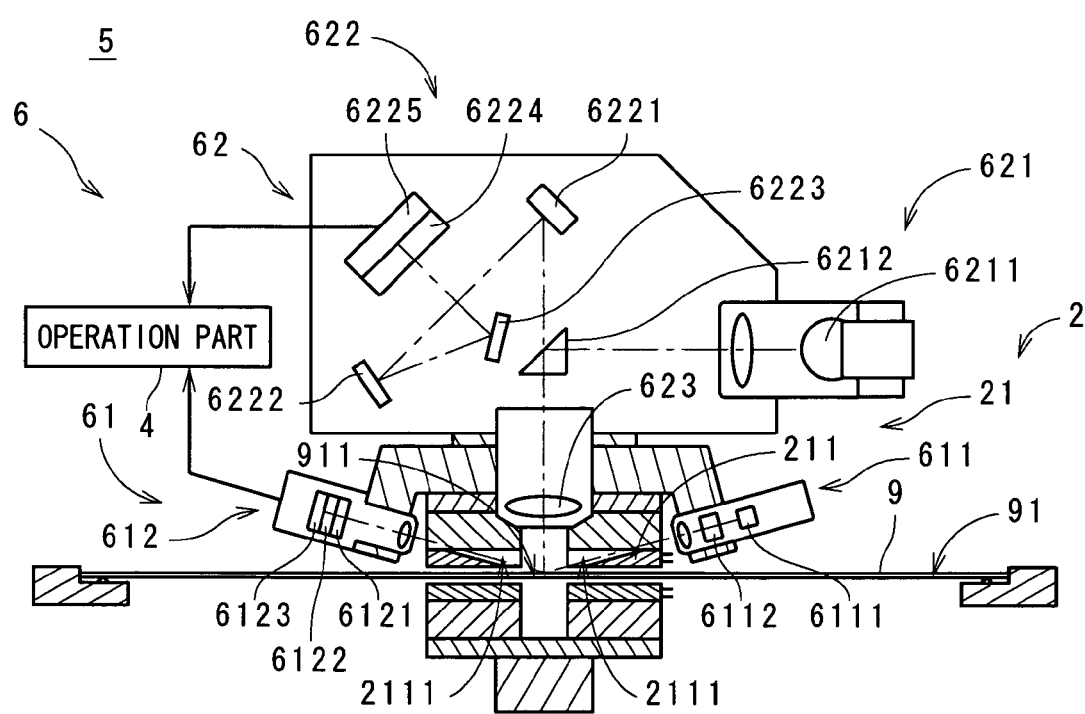
FIG. 5 is a longitudinal sectional view showing a construction of a film thickness measuring apparatus in accordance with the third preferred embodiment.

Next, discussion will be made on a film thickness measuring apparatus in accordance with the third preferred embodiment of the present invention. FIG. 5 is a longitudinal sectional view showing a construction of a film thickness measuring apparatus 5 in accordance with the third preferred embodiment. The film thickness measuring apparatus 5 is an apparatus for measuring a thickness of a film formed on an upper surface 91 of a substrate 9. In the film thickness measuring apparatus 5, a film thickness measuring part 6 shown in FIG. 5 is attached to a first fluid ejection part 21 of a substrate supporting apparatus 2, instead of the probe 31 of the measuring part 3 in the surface potential measuring apparatus 1 shown in FIGS. 1 to 3. The other constituent elements are the same as those of the surface potential measuring apparatus 1 shown in FIGS. 1 to 3 and represented by the same reference signs in the following discussion.

As shown in FIG. 5, the film thickness measuring part 6 has an ellipsometer 61 for acquiring information which is used to perform ellipsometry on the film formed on the substrate 9 and a spectrometer unit 62 for acquiring spectral intensity of a reflected light reflected on the substrate 9.

The ellipsometer 61 has a first light source part 611 which is attached to the first fluid ejection part 21 of the substrate supporting apparatus 2 and emits a light toward a target region 911 on the substrate 9 in a state where the light is inclined to the target region 911 and a first receiving part 612 which is attached to the first fluid ejection part 21 and receives a reflected light reflected on the target region 911 to acquire a polarization state of the reflected light. Data representing the polarization state acquired by the first receiving part 612 is outputted to an operation part 4 and a thickness of a film in the target region 911 is obtained on the basis of the data by the operation part 4.

The first light source part 611 has a laser diode 6111 which is a light source for emitting a laser beam and an electromagnetic shutter 6112 for shutting out the laser beam emitted from the laser diode 6111, and an ON/OFF control of emission of light to the substrate 9 is performed by the electromagnetic shutter 6112. The first receiving part 612 has a ¼ wave retardation plate array (hereinafter, referred to as "λ/4 plate array") 6121 formed of photonic crystal, a polarizer array 6122, and a CCD (Charge Coupled Device) 6123.

A plurality of areas whose crystal axes are different from one another are arranged in strip form in the λ/4 plate array 6121. Also in the polarizer array 6122, a plurality of areas whose crystal axes are different from one another are arranged in strip form. The polarizer array 6122 is arranged so that an arrangement direction of the plurality of areas arranged in strip form in the polarizer array 6122 is perpendicular to that of the plurality of areas arranged in strip form in the λ/4 plate array 6121.

Figure 6:
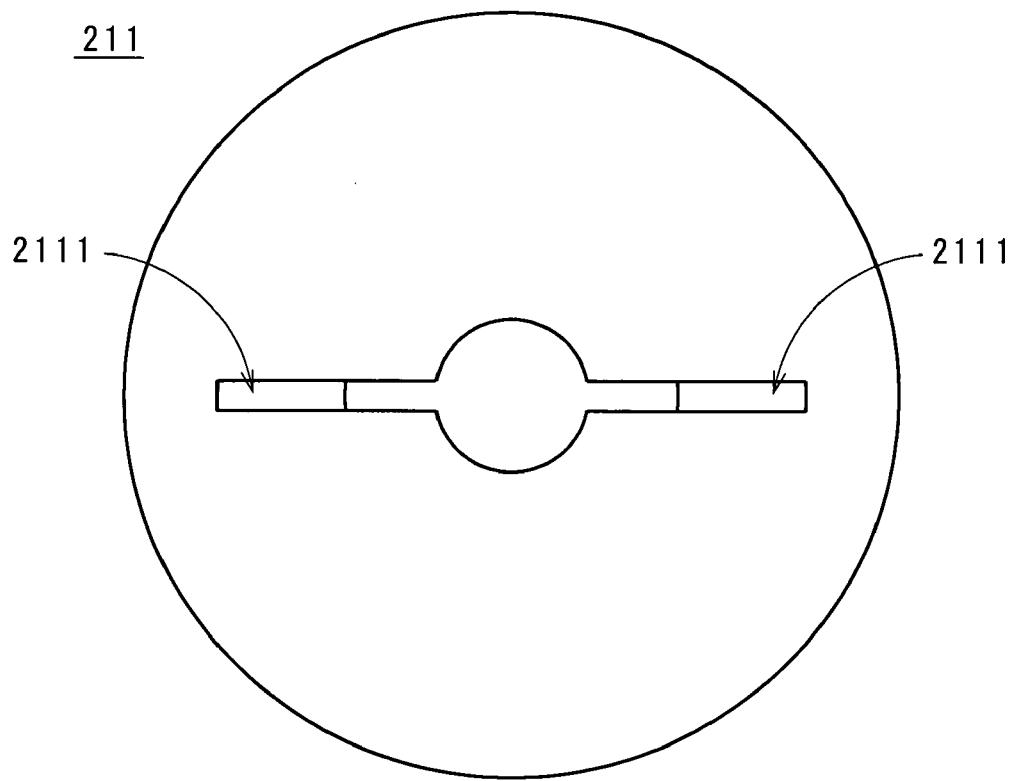
FIG. 6 is a plan view of a first porous member.

FIG. 6 is a plan view showing a first porous member 211 of the first fluid ejection part 21 in the substrate supporting apparatus 2. As shown in FIG. 6, the first porous member 211 has a circular shape surrounding the target region 911 on the substrate 9 (see FIG. 5) and two inclined grooves 2111 are formed on an upper surface of the first porous member 211 so as to be arranged on a straight line passing through the center of the first porous member 211 (i.e., the two inclined grooves 2111 are arranged on the opposite sides across the center of the first porous member 211), as shown in FIGS. 5 and 6. FIG. 5 also shows a part of a back portion of the cross section of the first porous member 211 (i.e., back portions of the inclined grooves 2111).

In the ellipsometer 61 of the film thickness measuring apparatus 5 shown in FIG. 5, the light emitted from the laser diode 6111 of the first light source part 611 passes through one inclined groove 2111 of the first porous member 211 and enters the target region 911 on the substrate 9, and the reflected light reflected on the target region 911 passes through the other inclined groove 2111 of the first porous member 211 and enters into the CCD 6123 through the λ/4 plate array 6121 and the polarizer array 6122 of the first receiving part 612. Intensity of the light which transmits various combinations of λ/4 plates with various crystal axes and polarizers with various crystal axes (i.e., data representing the polarization state of the reflected light) is acquired and outputted to the operation part 4 by the CCD 6123 and a thickness of a film in the target region 911 is obtained by ellipsometry in the operation part 4.

The spectrometer unit 62 has a second light source part 621 which is attached to the first fluid ejection part 21 of the substrate supporting apparatus 2 and emits a light toward the target region 911 on the substrate 9 and a second receiving part 622 which is attached to the first fluid ejection part 21 and spectrally disperses and receives a reflected light reflected on the target region 911. In the operation part 4, a thickness of a film in the target region 911 is obtained by spectroscopic reflectometry on the basis of an output from the second receiving part 622.

The second light source part 621 has a lamp 6211 for emitting a white light as an illumination light and a half mirror 6212 which reflects the light emitted from the lamp 6211 to direct the light onto the target region 911 on the substrate 9 through an objective lens 623. The second light receiving part 622 has a collimating mirror 6221 which receives a reflected light reflected on the target region 911 on the substrate 9 through the objective lens 623 and changes the reflected light to a parallel light, a reflection type grating 6222 for dispersing the parallel light reflected on the collimating mirror 6221, a focusing mirror 6223, a filter 6224, and a CCD 6225.

In the spectrometer unit 62 of the film thickness measuring apparatus 5, the illumination light emitted from the lamp 6211 of the second light source part 621 passes a space inside the first porous member 211 through the half mirror 6212 and the objective lens 623 and enters the target region 911 on the substrate 9. A reflected light reflected on the target region 911 passes through the space inside the first porous member 211 and further passes through the objective lens 623 and the half mirror 6212, and a dispersed light enters the CCD 6225 through the collimating mirror 6221, the grating 6222, the focusing mirror 6223, and the filter 6224 of the second light receiving part 622. Spectral intensity of the reflected light reflected on the target region 911 is acquired and outputted to the operation part 4 by the CCD 6225 and a thickness of the film in the target region 911 is obtained by the spectroscopic reflectometry in the operation part 4.

In the film thickness measuring apparatus 5, in a case where a film formed on the upper surface 91 of the substrate 9 held by the substrate supporting apparatus 2 is relatively thin, film thickness measurement by the ellipsometry is performed on the basis of the output representing the polarization state outputted from the ellipsometer 61, and in a case where the film is relatively thick or a multilayer film, a film thickness is calculated by the spectroscopic reflectometry while obtaining a spectral reflectance on the basis of the output representing the spectral intensity outputted from the spectrometer unit 62.

Similarly to the first preferred embodiment, the substrate 9 can be supported in the substrate supporting apparatus 2 of the film thickness measuring apparatus 5 while the substrate 9 is flattened between the first fluid ejection part 21 and the second fluid ejection part 22. Also, the distance between the substrate 9 and the first porous member 211 of the first fluid ejection part 21 can be made constant, with a simple construction. As a result, it is possible to measure a thickness of a film in the target region 911 on the substrate 9 by the ellipsometer 61 with high accuracy in the film thickness measuring apparatus 5. It is also possible to measure a thickness of the film in the target region 911 on the substrate 9 by the spectrometer unit 62. Further, it is possible to rapidly perform measurement of a film thickness of the whole substrate 9 by rapidly moving the first fluid ejection part 21 and the second fluid ejection part 22 relatively to the substrate 9.

Figure 7:
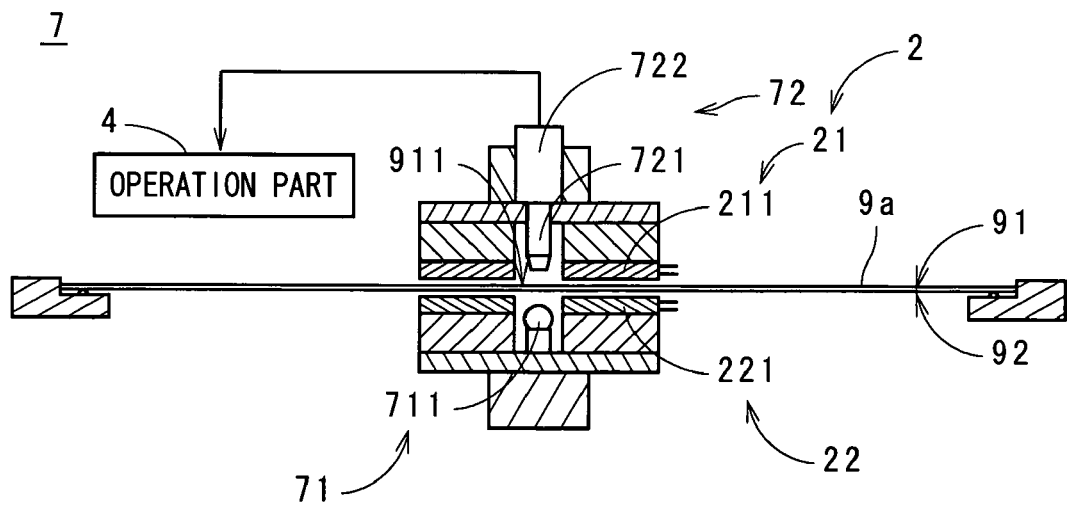
FIG. 7 is a longitudinal sectional view showing a construction of a substrate inspection apparatus in accordance with the fourth preferred embodiment.

Next discussion will be made on a substrate inspection apparatus in accordance with the fourth preferred embodiment of the present invention. FIG. 7 is a longitudinal sectional view showing a construction of the substrate inspection apparatus 7 in accordance with the fourth preferred embodiment. The substrate inspection apparatus 7 is an apparatus for inspecting a defect of a substrate 9a. The substrate 9a is formed by polishing a semiconductor substrate with a normal width (about 700 μm) and the width is made to about 30 μm (the substrate 9a is a so-called thin wafer). A cut mark of the substrate 9a is detected as a defect by the substrate inspection apparatus 7.

In the substrate inspection apparatus 7, a receiving part 72 is attached to a first fluid ejection part 21 as shown in FIG. 7, instead of the probe 31 of the measuring part 3 in the surface potential measuring apparatus 1 show in FIGS. 1 to 3. A light source part 71 is attached to a second fluid ejection part 22. The other constituent elements are the same as those of the surface potential measuring apparatus 1 shown in FIGS. 1 to 3 and represented by the same reference signs in the following discussion.

As shown in FIG. 7, the light source part 71 has a lamp 711 which is positioned below the substrate 9 and emits a light toward a target region 911 on an upper surface 91 of the substrate 9a through a space inside a second porous member 221 and the substrate 9a. The receiving part 72 has an objective lens 721 and a CCD 722. In the substrate inspection apparatus 7, a light emitted from the lamp 711 of the light source part 71 passes through the target region 911 and enters the objective lens 721 through a space inside a first porous member 211 to be received by the CCD 722. Data acquired by the CCD 722 is outputted to the operation part 4 and defect inspection of the target region 911 is performed on the basis of the data by the operation part 4.

In a substrate supporting apparatus 2 of the substrate inspection apparatus 7, similarly to the first preferred embodiment, the first fluid is ejected around the target region 911 on the upper surface 91 of the substrate 9a from the first porous member 211 of a first fluid ejection part 21, and the second fluid is ejected onto a lower surface 92 of the substrate 9a from the second porous member 221 of the second fluid ejection part 22 which is opposite to the first fluid ejection part 21 across the substrate 9a. With this operation, the substrate 9a can be supported and flattened between the first fluid ejection part 21 and the second fluid ejection part 22. Also, the distance between the substrate 9a and the first porous member 211 and the distance between the substrate 9a and the second porous member 221 can be made constant, with a simple construction. As a result, it is possible to perform defect inspection of the target region 911 on the substrate 9a with high accuracy in the substrate inspection apparatus 7. Further, it is possible to rapidly perform defect inspection of the whole substrate 9a by rapidly moving the first fluid ejection part 21 and the second fluid ejection part 22 relatively to the substrate 9a.

Though the preferred embodiments of the present invention have been discussed above, the present invention is not limited to the above-discussed preferred embodiments, but allows various variations.

In the surface potential measuring apparatuses according to the first and second preferred embodiments, the first fluid ejection part 21 to which the probe 31 is attached is not necessarily positioned above the substrate 9 in a gravity direction, but there may be a case where the first fluid ejection part 21 is positioned below the substrate 9 and the second fluid ejection part 22 is positioned above the substrate 9 (the same as in the film thickness measuring apparatus 5 in accordance with the third preferred embodiment).

In the surface potential measuring apparatus 1 according to the first preferred embodiment, the probe 31 may be attached to both of the first fluid ejection part 21 and the second fluid ejection part 22 to measure surface potentials of the upper surface 91 and the lower surface 92 of the substrate 9.

In the surface potential measuring apparatus 1a according to the second preferred embodiment, there may be a case where an exhausting apparatus is connected to the first closing part 213a of the first fluid ejection part 21 and the space inside the first closing part 213a and the space inside the first base part 212 and the first porous member 211 (i.e., space above the target region 911) may be made to a reduced pressure atmosphere (including a vacuum atmosphere). In a case where the above spaces are made to the vacuum atmosphere, since the first fluid flows into the space inside the first porous member 211 from an inner surface of the first porous member 211 or the like, the space is made to a low vacuum atmosphere. In this time, the distance between the first porous member 211 and the upper surface 91 of the substrate 9 is made to about 5 μm.

A dome-shaped second closing part which has the same shape as the first closing part 213a of the first fluid ejection part 21 is provided in the second fluid ejection part 22 of the surface potential measuring apparatus 1a shown in FIG. 4, instead of the second closing part 223, and a space inside the second closing part and a space inside the second base part 222 and the second porous member 221 may be made to the inert gas atmosphere or the reduced pressure atmosphere (including the vacuum atmosphere). In a case where the space inside the first porous member 211 is made to the reduced pressure atmosphere, the space inside the second porous member 221 is also made to the reduced pressure atmosphere and thereby pressing forces which are applied to the substrate 9 from the first fluid ejection part 21 and the second fluid ejection part 22 can be easily made to be equal and the substrate 9 can be supported more stably.

In the film thickness measuring apparatus 5 and the substrate inspection apparatus 7 according to the third and fourth preferred embodiments, the first fluid and the second fluid ejected from the first porous member 211 and the second porous member 221 are not necessarily limited to gasses but may be, for example, liquids with a relatively low viscosity such as pure water.

One of the ellipsometer 61 and the spectrometer unit 62 may be provided as the film thickness measuring part 6 in the film thickness measuring apparatus 5 according to the third preferred embodiment. There may be a case where one or both of the ellipsometer 61 and the spectrometer unit 62 is (are) attached to the first fluid ejection part 21 and one or both of the ellipsometer 61 and the spectrometer unit 62 is (are) also attached to the second fluid ejection part 22 to measure film thicknesses of the upper surface 91 and the lower surface 92 of the substrate 9.

In the film thickness measuring apparatus 5, an ellipsometer where the first light source part 611 has polarizers and a λ/4 wave retardation plate and the first receiving part 612 has a rotating analyzer, is attached to the first fluid ejection part 21, instead of the above-discussed ellipsometer 61. In this case, a polarized light enters the target region 911 on the substrate 9 in a state where the light is inclined to the target region 911.

In the substrate inspection apparatus 7 according to the fourth preferred embodiment, defect inspection of the substrate 9a is not necessarily performed, but may be performed inspection of a pattern formed on the substrate 9a, measurement of a thickness of the substrate 9a, or the like.

In the substrate supporting apparatuses 2 according to the preferred embodiments, there may be a case where the probe 31 for surface potential measurement is attached to the first fluid ejection part 21, and the ellipsometer 61 and/or the spectrometer unit 62 for film thickness measurement are (is) attached to the second fluid ejection part 22. Also, there may be a case where the ellipsometer 61 and/or the spectrometer unit 62 are (is) attached to the first fluid ejection part 21, and the probe 31 is attached to the second fluid ejection part 22.

The first fluid ejection part 21 and the second fluid ejection part 22 are not necessarily connected each other in the substrate supporting apparatus 2, but there may be a case where a moving mechanism for moving the second fluid ejection part 22 is provided independently of a mechanism for moving the first fluid ejection part 21 and the both moving mechanisms are driven in synchronization with each other. A magnet is incorporated into the first fluid ejection part 21 and the second fluid ejection part 22, and the second fluid ejection part 22 may move following the first fluid ejection part 21 by magnetic force when the first fluid ejection part 21 moves by the moving mechanism.

There may be a case where positions of the first fluid ejection part 21 and the second fluid ejection part 22 are fixed in the substrate supporting apparatus 2 and a substrate is moved in the horizontal direction (i.e., a direction parallel to the upper surface and the lower surface of the substrate), to thereby achieve relative movement of the first fluid ejection part 21 and the second fluid ejection part 22 to the substrate. This makes it possible to simplify a construction for relative movement of the first fluid ejection part 21 and the second fluid ejection part 22. On the other hand, like the above-discussed substrate supporting apparatus, by providing the construction for moving the first fluid ejection part 21 and the second fluid ejection part 22, an area required for setting the apparatus can be decreased.

The auxiliary supporting part 232 of the substrate supporting apparatus 2 may be provided separately from the movement control part 231. The auxiliary supporting part 232 is omitted from the substrate supporting apparatus 2 and the substrate may be supported only by the first fluid ejection part 21 and the second fluid ejection part 22.

The movement control part 231 is not necessarily in contact with the outer peripheral surface of the substrate only if it is in contact with the perimeter part 93 of the substrate. For example, the movement control part 231 is brought into contact with a portion close to an outer peripheral edge of the lower surface 92 of the substrate, and movement of the substrate may be controlled by the friction between the lower surface 92 of the substrate and the movement control part, caused by weight of the substrate. In this case, the auxiliary supporting part 232 of the substrate supporting apparatus 2 may serve as the movement control part.

In the substrate supporting apparatus 2, for example, loading and unloading of a substrate to/from the substrate supporting apparatus 2 are performed in a state where the first fluid ejection part 21 is moved in a direction perpendicular to the upper surface 91 of the substrate 9. In this case, the first fluid ejection part 21 is fixed so as not to move in the up and down direction in measurement of a surface potential or the like. The first fluid ejection part 21 may move in the up and down direction in measurement of a surface potential or the like.

The shape of the first porous member 211 and the second porous member 221 may be a circular shape where the center of the inner peripheral edge and the center of the outer peripheral edge are shifted (i.e., a circular shape where an internal space is eccentric). The first porous member 211 and the second porous member 221 do not necessarily have a circular shape but may have a ring shape of other outer form (e.g., rectangle) or may have other shape other than the ring shape. For example, the first fluid may be ejected around the target region 911 from a U-shaped first porous member 211 between which the target region 911 is sandwiched in plan view. The first porous member 211 may be two bar-like porous members which are parallel and sandwich the target region 911 so as to be opposite to each other.

The first porous member 211 and the second porous member 221 do not necessarily have the same shape in the substrate supporting apparatus 2, but the second fluid ejection part 22 may be made larger than the first fluid ejection part 21 in plan view, for example. In a case where an upper surface of a second porous member (i.e., a surface of the second porous member facing a substrate) is formed with high accuracy, such as a case where a substrate to be supported is relatively small, the shape of the second porous member is made the same as that of a lower surface of the substrate, and the second fluid may be uniformly ejected onto the whole lower surface of the substrate from the second porous member. In this case, only the first fluid ejection part 21 is moved relatively to the substrate by the ejection part moving mechanism 25.

In the substrate supporting apparatus 2 according to the preferred embodiments, various devices or the like used for other measurement or inspection other than the above-discussed surface potential measurement, film thickness measurement, or defect inspection, may be attached to the first fluid ejection part 21 and/or the second fluid ejection part 22. In the substrate supporting apparatus 2 according to the second preferred embodiment, in accordance with a device attached to the first porous member 211, the space inside the first porous member 211 can be made to an atmosphere which is suitable for measurement or inspection by the device. The substrate supporting apparatuses 2 according to the first to fourth preferred embodiments may be independently used as a substrate supporting apparatus.

The substrate supporting apparatus 2 can be used for supporting a glass substrate for a flat panel display such as a liquid crystal display or a plasma display, as well as a semiconductor substrate. Further, the substrate supporting apparatus 2 can be used for supporting other substrate (for example, a plastic substrate on which a thin film of an organic semiconductor is formed (or is to be formed) or a plastic film substrate used for a solar cell).

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2007-008750 filed in the Japan Patent Office on Jan. 18, 2007, the entire disclosure of which is incorporated herein by reference.

What is claimed is:

1. A substrate supporting apparatus for supporting a substrate, comprising:
   a first fluid ejection part having a first porous member for ejecting a first fluid around a target region on one main surface of a substrate;
   a second fluid ejection part which is positioned opposite to said first fluid ejection part and has a second porous member for ejecting a second fluid onto the other main surface of said substrate, to support said substrate between said first porous member and said second porous member in a noncontact manner;
   a movement control part which is in contact with a perimeter part of said substrate and controls movement of said substrate in a direction parallel to said one main surface; and
   a moving mechanism for shifting said target region by moving said first fluid ejection part relatively to said substrate along said one main surface of said substrate.

2. The substrate supporting apparatus according to claim 1, wherein
   said first porous member has a ring shape surrounding said target region.

3. The substrate supporting apparatus according to claim 2, wherein
   said second fluid ejection part ejects said second fluid onto a part of said other main surface of said substrate and moves relatively to said substrate together with said first fluid ejection part, and
   said first porous member and said second porous member have the same shape and overlap each other in a direction perpendicular to said substrate.

4. The substrate supporting apparatus according to claim 2, wherein
   said first porous member has a circular shape.

5. The substrate supporting apparatus according to claim 4, wherein
   said second fluid ejection part ejects said second fluid onto a part of said other main surface of said substrate and moves relatively to said substrate together with said first fluid ejection part, and
   said first porous member and said second porous member have the same shape and overlap each other in a direction perpendicular to said substrate.

6. The substrate supporting apparatus according to claim 2, wherein
   said first fluid ejection part further comprises a closing part which is located on said first porous member to close a space inside said first porous member.

7. The substrate supporting apparatus according to claim 6, wherein
   said space inside said first porous member is made to an inert gas atmosphere or a reduced pressure atmosphere.

8. The substrate supporting apparatus according to claim 1, wherein
   said second fluid ejection part ejects said second fluid onto a part of said other main surface of said substrate and moves relatively to said substrate together with said first fluid ejection part.

9. The substrate supporting apparatus according to claim 8, wherein
   said first porous member and said second porous member have the same shape and overlap each other in a direction perpendicular to said substrate.

10. The substrate supporting apparatus according to claim 8, further comprising
    an auxiliary supporting part for auxiliary supporting said substrate in the vicinity of said perimeter part of said substrate.

11. The substrate supporting apparatus according to claim 1, wherein
    a distance between said one main surface of said substrate and said first porous member is made to be equal to or greater than 5 μm and equal to or smaller than 30 μm.

12. The substrate supporting apparatus according to claim 1, further comprising
    an auxiliary supporting part for auxiliary supporting said substrate in the vicinity of said perimeter part of said substrate.

13. The substrate supporting apparatus according to claim 1, wherein
    said first fluid is a gas.

14. A surface potential measuring apparatus for measuring a surface potential of a substrate, comprising:
    a substrate supporting apparatus comprising a first fluid ejection part having a first porous member for ejecting a first fluid which is a gas around a target region on one main surface of a substrate, a second fluid ejection part which is positioned opposite to said first fluid ejection part and has a second porous member for ejecting a second fluid onto the other main surface of said substrate, to support said substrate between said first porous member and said second porous member in a noncontact manner, a movement control part which is in contact with a perimeter part of said substrate and controls movement of said substrate in a direction parallel to said one main surface, and a moving mechanism for shifting said target region by moving said first fluid ejection part relatively to said substrate along said one main surface of said substrate;

a measuring part having a probe which is attached to said first fluid ejection part of said substrate supporting apparatus and is opposite to said target region on said substrate; and an operation part for obtaining a surface potential of said target region on the basis of an output from said measuring part.

15. The surface potential measuring apparatus according to claim 14, wherein said second fluid ejection part ejects said second fluid onto a part of said other main surface of said substrate and moves relatively to said substrate together with said first fluid ejection part.

16. The surface potential measuring apparatus according to claim 15, wherein said first porous member and said second porous member have the same shape and overlap each other in a direction perpendicular to said substrate.

17. A film thickness measuring apparatus for measuring a thickness of a film formed on a substrate, comprising:

a substrate supporting apparatus comprising a first fluid ejection part having a first porous member for ejecting a first fluid around a target region on one main surface of a substrate, a second fluid ejection part which is positioned opposite to said first fluid ejection part and has a second porous member for ejecting a second fluid onto the other main surface of said substrate, to support said substrate between said first porous member and said second porous member in a noncontact manner, a movement control part which is in contact with a perimeter part of said substrate and controls movement of said substrate in a direction parallel to said one main surface, and a moving mechanism for shifting said target region by moving said first fluid ejection part relatively to said substrate along said one main surface of said substrate;

a light source part which is attached to said first fluid ejection part of said substrate supporting apparatus and emits a light toward said target region on said substrate in a state where said light is inclined to said target region;

a receiving part which is attached to said first fluid ejection part and receives a reflected light reflected on said target region to acquire a polarization state of said reflected light; and an operation part for obtaining a thickness of a film in said target region on the basis of said polarization state acquired by said receiving part.

18. The film thickness measuring apparatus according to claim 17, wherein said second fluid ejection part ejects said second fluid onto a part of said other main surface of said substrate and moves relatively to said substrate together with said first fluid ejection part.

19. The film thickness measuring apparatus according to claim 18, wherein said first porous member and said second porous member have the same shape and overlap each other in a direction perpendicular to said substrate.

20. A film thickness measuring apparatus for measuring a thickness of a film formed on a substrate, comprising:

a substrate supporting apparatus comprising a first fluid ejection part having a first porous member for ejecting a first fluid around a target region on one main surface of a substrate, a second fluid ejection part which is positioned opposite to said first fluid ejection part and has a second porous member for ejecting a second fluid onto the other main surface of said substrate, to support said substrate between said first porous member and said second porous member in a noncontact manner, a movement control part which is in contact with a perimeter part of said substrate and controls movement of said substrate in a direction parallel to said one main surface, and a moving mechanism for shifting said target region by moving said first fluid ejection part relatively to said substrate along said one main surface of said substrate;

a light source part which is attached to said first fluid ejection part of said substrate supporting apparatus and emits a light toward said target region on said substrate;

a receiving part which is attached to said first fluid ejection part and receives a reflected light reflected on said target region; and an operation part for obtaining a thickness of a film in said target region by spectroscopic reflectometry on the basis of an output from said receiving part.

21. The film thickness measuring apparatus according to claim 20, wherein said second fluid ejection part ejects said second fluid onto a part of said other main surface of said substrate and moves relatively to said substrate together with said first fluid ejection part.

22. The film thickness measuring apparatus according to claim 21, wherein said first porous member and said second porous member have the same shape and overlap each other in a direction perpendicular to said substrate.

23. A substrate inspection apparatus for inspecting a substrate, comprising:

a substrate supporting apparatus comprising a first fluid ejection part having a first porous member for ejecting a first fluid around a target region on one main surface of a substrate, a second fluid ejection part which is positioned opposite to said first fluid ejection part and has a second porous member for ejecting a second fluid onto the other main surface of said substrate, to support said substrate between said first porous member and said second porous member in a noncontact manner, a movement control part which is in contact with a perimeter part of said substrate and controls movement of said substrate in a direction parallel to said one main surface, and a moving mechanism for shifting said target region by moving said first fluid ejection part relatively to said substrate along said one main surface of said substrate;

a light source part which is attached to one of said first fluid ejection part and said second fluid ejection part of said substrate supporting apparatus and emits a light toward said target region on said substrate;

a receiving part which is attached to the other of said first fluid ejection part and said second fluid ejection part and receives a light passing through said target region; and an operation part for performing inspection or measurement on said target region on the basis of an output from said receiving part.

24. The substrate inspection apparatus according to claim 23, wherein
said second fluid ejection part ejects said second fluid onto a part of said other main surface of said substrate and moves relatively to said substrate together with said first fluid ejection part.

25. The substrate inspection apparatus according to claim 24, wherein
said first porous member and said second porous member have the same shape and overlap each other in a direction perpendicular to said substrate.

* * * * *